US008828761B2

(12) United States Patent
Kim et al.

(10) Patent No.: US 8,828,761 B2
(45) Date of Patent: Sep. 9, 2014

(54) MANUFACTURING A SEMICONDUCTOR LIGHT EMITTING DEVICE USING A TRENCH AND SUPPORT SUBSTRATE

(71) Applicant: Samsung Electronics Co., Ltd., Gyeonggi-do (KR)

(72) Inventors: Sung Joon Kim, Gyeonggi-do (KR); Tae Sung Jang, Gyeonggi-do (KR); Jong Gun Woo, Gyeonggi-do (KR); Yung Ho Ryu, Gyeonggi-do (KR); Tae Hun Kim, Gyeonggi-do (KR); Sang Yeob Song, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/801,903

(22) Filed: Mar. 13, 2013

(65) Prior Publication Data
US 2013/0244356 A1  Sep. 19, 2013

(30) Foreign Application Priority Data

Mar. 14, 2012 (KR) .................. 10-2012-0026067

(51) Int. Cl.
*H01L 21/00* (2006.01)
*H01L 33/00* (2010.01)
*H01L 33/60* (2010.01)

(52) U.S. Cl.
CPC .......... *H01L 33/005* (2013.01); *H01L 33/0079* (2013.01); *H01L 33/0095* (2013.01); *H01L 33/60* (2013.01)
USPC ............................. 438/33; 438/458; 438/462

(58) Field of Classification Search
None
See application file for complete search history.

(56) References Cited

U.S. PATENT DOCUMENTS

| 6,818,531 | B1 * | 11/2004 | Yoo et al. | 438/458 |
| 6,884,646 | B1 * | 4/2005 | Wu et al. | 438/22 |
| 7,208,337 | B2 * | 4/2007 | Eisert et al. | 438/42 |
| 2003/0017633 | A1 * | 1/2003 | Doi et al. | 438/22 |
| 2004/0056254 | A1 * | 3/2004 | Bader et al. | 257/79 |
| 2005/0258442 | A1 * | 11/2005 | Seo et al. | 257/88 |
| 2006/0214173 | A1 * | 9/2006 | Beeson et al. | 257/88 |
| 2006/0231852 | A1 * | 10/2006 | Kususe et al. | 257/99 |
| 2009/0029499 | A1 * | 1/2009 | Nakahara | 438/46 |
| 2012/0241786 | A1 * | 9/2012 | Odnoblyudov et al. | 257/98 |
| 2012/0244683 | A1 * | 9/2012 | Akagi | 438/464 |

FOREIGN PATENT DOCUMENTS

| KR | 2006-0041383 A | 5/2006 |
| KR | 2007-0100852 A | 10/2007 |
| KR | 2008-0081620 A | 9/2008 |

* cited by examiner

*Primary Examiner* — Andres Munoz
(74) *Attorney, Agent, or Firm* — McDermott Will & Emery LLP (57) ABSTRACT

A method for manufacturing a semiconductor light emitting device, includes: forming a light emitting structure having a first conductivity-type semiconductor layer, an active layer, and a second conductivity-type semiconductor layer on a growth substrate. A trench is formed in a portion to divide the light emitting structure into individual light emitting structures. The trench has a depth such that the growth substrate is not exposed. A support substrate is provided on the light emitting structure. The growth substrate is separated from the light emitting structure. The light emitting structure is cut into individual semiconductor light emitting devices.

20 Claims, 9 Drawing Sheets

MANUFACTURING A SEMICONDUCTOR LIGHT EMITTING DEVICE USING A TRENCH AND SUPPORT SUBSTRATE

CROSS-REFERENCE TO RELATED APPLICATION

This application claims benefit of priority to Korean Patent Application No. 10-2012-0026067 filed on Mar. 14, 2012, in the Korean Intellectual Property Office, the entire contents of which are hereby incorporated by reference.

TECHNICAL FIELD

The present inventive concept relates to a method for manufacturing a semiconductor light emitting device.

BACKGROUND

A light emitting diode (LED) is a device including a material that emits light through the application of electrical energy thereto, in which energy generated by electron hole recombination in semiconductor junction parts is converted into light to be emitted therefrom. LEDs are commonly employed as light sources in general illumination devices, display devices, and the like, and the development of LEDs has thus been accelerated.

In particular, recently, the development and employment of gallium nitride-based LEDs has increased, and mobile device keypads, signal lamps of vehicles, camera flashes, and the like, using such a gallium nitride-based LED, have been commercialized. In line with this, the development of general illumination devices using LEDs has accelerated. Products in which LEDs are utilized, such as a backlight unit of a large TV, a vehicle headlamp, a general illumination device, and the like, are gradually moving toward large-sized products having high outputs and high efficiency. Thus, the LEDs used in such products need to satisfy a high level requirement of the characteristics of the LEDs. However, LEDs have a problem in which a semiconductor layer thereof is damaged during a manufacturing process. Thus, a need exists for a method for manufacturing a semiconductor light emitting device capable of reducing damage to a semiconductor layer.

SUMMARY

An aspect of the present inventive concept relates to a method for manufacturing a semiconductor light emitting device, including forming a light emitting structure having a first conductivity-type semiconductor layer, an active layer, and a second conductivity-type semiconductor layer on a growth substrate. A trench is formed in a portion to divide the light emitting structure into individual light emitting structures. The trench has a depth such that the growth substrate is not exposed. A support substrate is provided on the light emitting structure. The growth substrate is separated from the light emitting structure. The light emitting structure is cut into individual semiconductor light emitting devices.

The trench may be formed in a region to be removed when the light emitting structure is cut into individual semiconductor light emitting devices.

The trench may be formed such that each of the individual light emitting structures is isolated.

The trench may have a depth ranging from 3% to 25% of a thickness of the light emitting structure.

The trench may be formed to have a depth ranging from 2000 Å to 15000 Å.

The trench may be formed through an inductively coupled plasma reactive ion etching (ICPRIE) method.

The trench may be formed through a wet etching method.

The trench may have sloped side walls.

The method may further include: forming an insulating layer on an inner surface of the trench, before the providing of the support substrate on the light emitting structure.

The insulating layer may include a material selected from $SiO_2$, $SiN_x$, $Si_3N_4$, $Al_2O_3$, and $TiO_2$.

The method may further include: forming a reflective layer on one surface of the light emitting structure.

The reflective layer may include a material selected from indium tin oxide (ITO), silver (Ag), nickel (Ni), aluminum (Al), titanium (Ti), palladium (Pd), platinum (Pt), ruthenium (Ru), gold (Au), rhodium (Rh), iridium (Ir), AgCu, and AgCuPd.

The reflective layer may include a distributed Bragg reflector (DBR).

The method may further include filling the trench with a bonding layer, after the forming of the insulating layer on the inner surface of the trench.

The bonding layer may include a material selected from nickel (Ni), tin (Sn), platinum (Pt), titanium (Ti), gold (Au), Au—Sn, indium (In), Au—Ag, and Pb—Sn.

The separating of the growth substrate from the light emitting structure may be performed according to a laser lift-off method.

The trench may have a width ranging from 7 μm to 20 μm.

Another aspect of the present inventive concept encompasses a method for manufacturing a semiconductor light emitting device, including forming a light emitting structure having a first conductivity-type semiconductor layer, an active layer, and a second conductivity-type semiconductor layer on a growth substrate. A trench is formed in a portion of the light emitting structure to divide the light emitting structure into individual light emitting structures. The trench has a depth such that the growth substrate is not exposed. The light emitting structure is cut into individual semiconductor light emitting devices such that the region of the light emitting structure in which the trench is formed is removed.

The method may further include providing a support substrate on the light emitting structure and separating the growth substrate from the light emitting structure.

BRIEF DESCRIPTION OF THE DRAWINGS

The foregoing and other features of the inventive concept will be apparent from more particular description of embodiments of the inventive concept, as illustrated in the accompanying drawings in which like reference characters may refer to the same or similar parts throughout the different views. The drawings are not necessarily to scale, emphasis instead being placed upon illustrating the principles of the embodiments of the inventive concept. In the drawings, the thickness of layers and regions may be exaggerated for clarity.

DETAILED DESCRIPTION

Examples of the present inventive concept will be described below in more detail with reference to the accompanying drawings. The examples of the present inventive concept may, however, be embodied in different forms and should not be construed as limited to the examples set forth herein. Like reference numerals may refer to like elements throughout the specification.

FIGS. 1 to 7 are cross-sectional views schematically illustrating a sequential process of a method for manufacturing a semiconductor light emitting device according to an embodiment of the present inventive concept.

Figure 1:
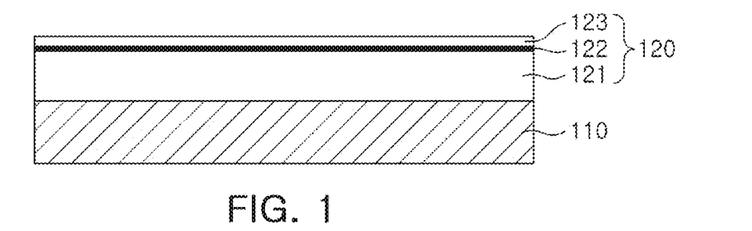
FIGS. 1 to 7 are cross-sectional views schematically illustrating a sequential process of a method for manufacturing a semiconductor light emitting device according to an embodiment of the present inventive concept.

First, as illustrated in FIG. 1, a light emitting structure 120 is formed by stacking a first conductivity-type semiconductor layer 121, an active layer 122, and a second conductivity-type semiconductor layer 123 on an upper surface of a growth substrate 110.

The growth substrate 110 may be a substrate for growing a semiconductor single crystal, for example, a nitride single crystal. Specifically, a substrate made of a material such as sapphire, silicon (Si), Si, ZnO, GaAs, SiC, $MgAl_2O_4$, MgO, $LiAlO_2$, $LiGaO_2$, GaN, or the like, may be used as the growth substrate 110. In this case, sapphire has a crystal structure having Hexa-Rhombo R3symmetry, of which lattice constants in c-axis and a-axis directions are 13.001 Å and 4.758 Å, respectively. A sapphire crystal has a C-plane (0001), an A-plane (1120), an R-plane (1102), and the like. In this case, a nitride thin film can be relatively easily formed on the C-plane of the sapphire crystal, and because the sapphire crystal is stable at high temperatures, in particular, it is used as a material for a nitride growth substrate.

Here, the first and second conductivity-type semiconductor layers 121 and 123 may be made of a nitride semiconductor, namely, a semiconductive material doped with an n-type impurity and a p-type impurity having an empirical formula $Al_xIn_yGa_{(1-x-y)}N$ (here, $0 \le x \le 1$, $0 \le y \le 1$, $0 \le x+y \le 1$). The semiconductive material may be GaN, AlGaN, InGaN, or the like. Silicon (Si), germanium (Ge), selenium (Se), tellurium (Te), or the like, may be used as the n-type impurity. Manganese (Mg), zinc (Zn), beryllium (Be), or the like, may be used as the p-type impurity. The first and second conductivity-type semiconductor layers 121 and 123 may be grown through a process, such as metal-organic chemical vapor deposition (MOCVD), hydride vapor phase epitaxy (HVPE), molecular beam epitaxy (MBE), or the like.

The active layer 122 is formed between the first conductivity-type semiconductor layer 121 and the second conductivity-type semiconductor layer 123. The active layer 122 has a multi-quantum well (MQW) structure in which quantum well layers and quantum barrier layers are alternately laminated. For example, the active layer 122 has an MQW structure in which $Al_xIn_yGa_{(1-x-y)}N$ ($0 \le x \le 1$, $0 \le y \le 1$, $0 \le x+y \le 1$) quantum barrier layers and quantum well layers are alternately laminated to have a certain band gap, and electrons and holes may be recombined by the quantum wells to emit light. The active layer 122 may be grown through a process such as metal-organic chemical vapor deposition (MOCVD), hydride vapor phase epitaxy (HVPE), molecular beam epitaxy (MBE), or the like, in the same manner as that of the first and second conductivity-type semiconductor layers 121 and 123.

Meanwhile, although not separately shown, before the first conductivity-type semiconductor layer 121 is formed, a buffer layer may be formed on the growth substrate 110. The buffer layer may be formed to alleviate a difference between lattice constants of the growth substrate 110 and the first conductivity-type semiconductor layer 121. In an embodiment of the present inventive concept, a gallium nitride layer may be used as the buffer layer.

Figure 2:
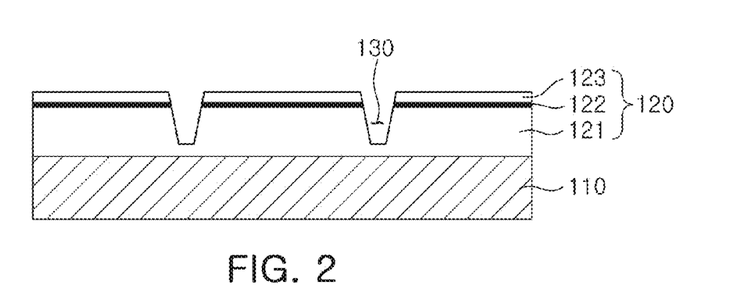

Next, as shown in FIG. 2, a surface of the light emitting structure 120 is etched to form a trench 130.

The trench 130 may be formed by etching portions of the light emitting structure 120 to have a depth from the surface of the light emitting structure 120 at which the growth substrate 110 is not exposed. Here, an inductively coupled plasma reactive ion etching (ICPRIE) method or a wet etching method may be used for the etching process, but the present inventive concept is not necessarily limited thereto.

The trench 130 may be formed in a region of the light emitting structure 120 to be removed during an isolating process of cutting into individual semiconductor light emitting devices 100. Side walls of the trench 130 may be sloped at a certain angle with respect to a bottom surface of the trench 130. When the side walls of the trench 130 are formed to be sloped, a material layer can be easily grown in comparison to vertical side walls.

In this manner, the trench 130 may be formed have a cross-section having sloped side walls and a bottom surface, but the present inventive concept is not limited thereto and the trench 130 may be variably modified. For example, the trench 130 may be formed to have a V-shaped cross section only having sloped side walls, or may have vertical side walls. Also, the trench 130 may be formed to have an elongated linear shape when viewed from above the light emitting structure 120, or may have a shape of an intermittent dotted line.

Figure 10:
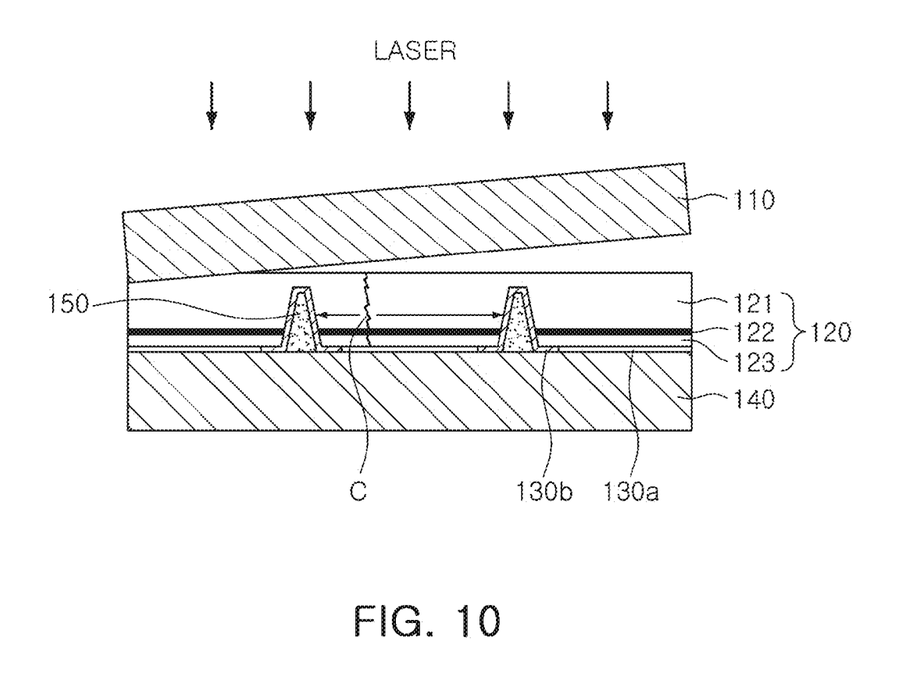
FIG. 10 is a cross-sectional view illustrating a crack propagation path in a semiconductor light emitting device according to an embodiment of the present inventive concept.

FIG. 10 is a cross-sectional view illustrating a crack propagation path in the semiconductor light emitting device 100 according to an embodiment of the present inventive concept.

As illustrated in FIG. 10, the trench 130 serves to prevent cracks C from spreading to the entire light emitting structure 120. The cracks C may be generated in a region of the light emitting structure 120 on the growth substrate 110 due to thermal impact of laser, stress, or the like, during a laser lift-off (LLO) process performed to remove the growth substrate 110 in manufacturing the semiconductor light emitting device 100.

Figure 11:
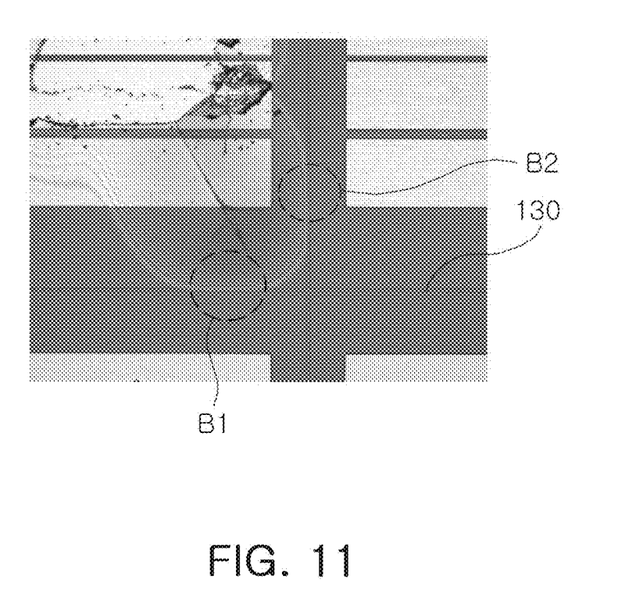
FIG. 11 is a photograph image showing cracks generated when a trench is formed to have a depth of 2000 Å.
Figure 12A:
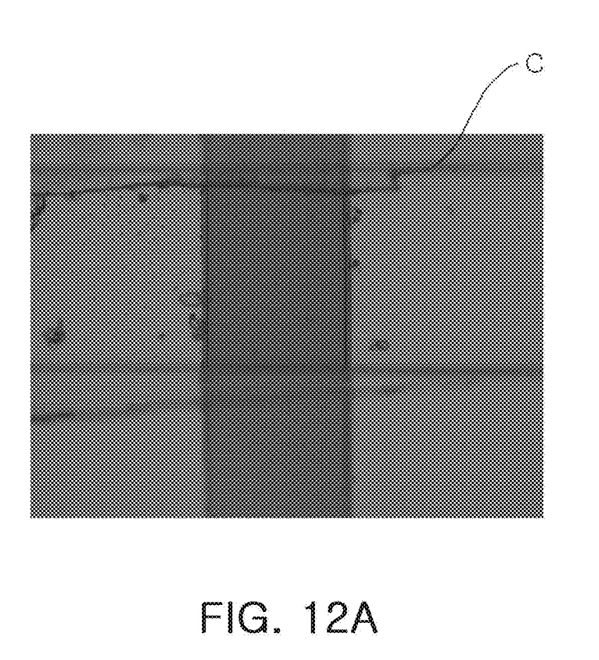
FIGS. 12A, 12B and 12C are photograph images showing a comparison between a semiconductor light emitting device without a trench and a semiconductor light emitting device with a trench formed to have a depth of 15000 Å according to an embodiment of the present inventive concept.
Figure 12B:
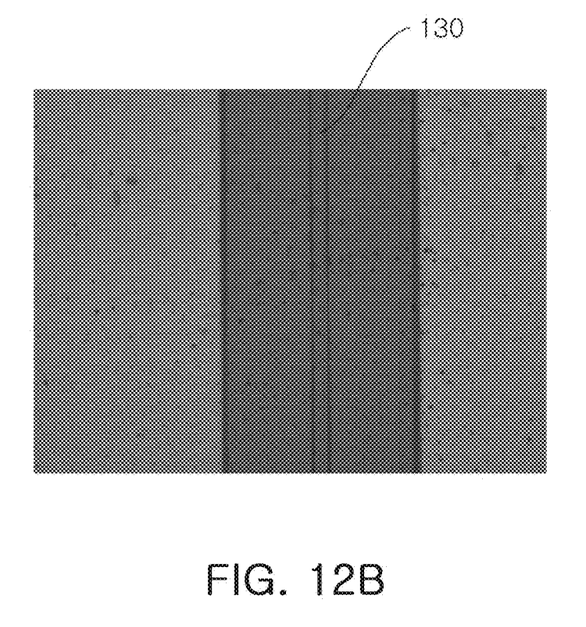
Figure 12C:
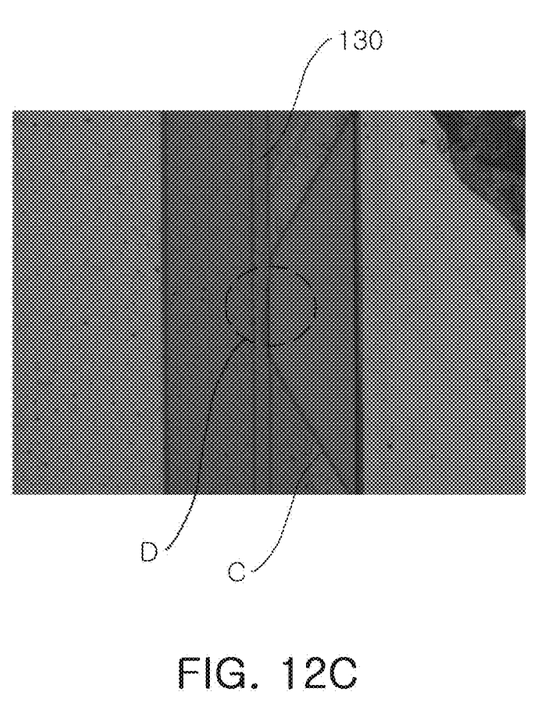

As shown in portions B1 and B2 in FIG. 11 and a portion D in FIG. 12C, when the trench 130 is formed, although a crack C is generated in a region of the light emitting structure 120, the crack C is blocked, rather than spreading to the entire light emitting structure 120.

Figure 7:
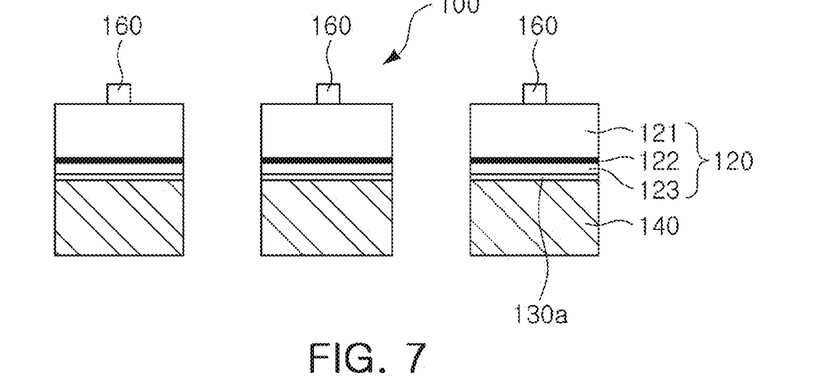
Figure 8:
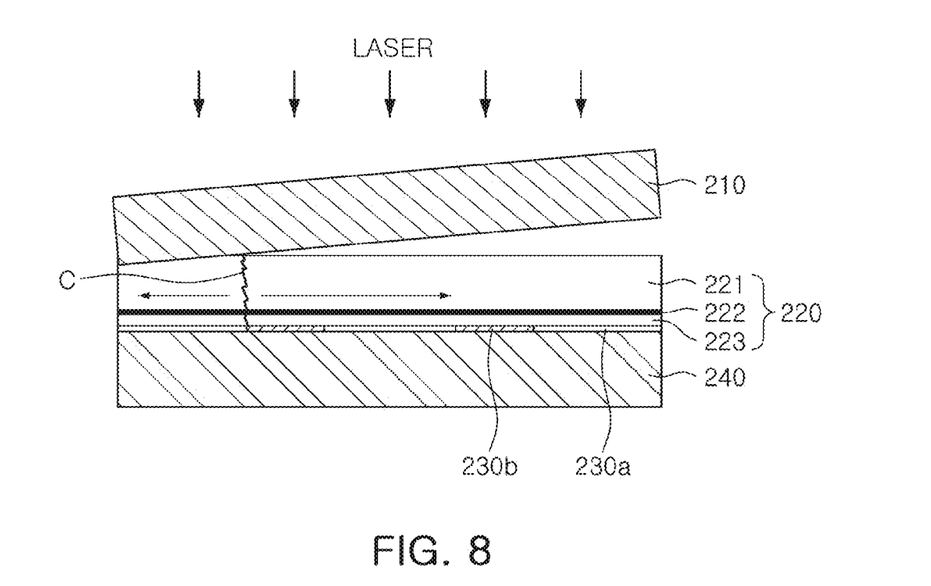
FIG. 8 is a view schematically showing a crack propagation path in a comparative example.
Figure 9:
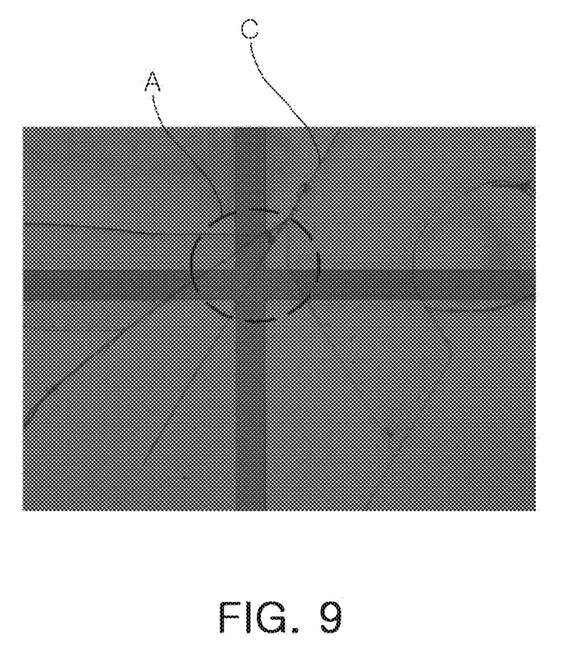
FIG. 9 is a photograph image showing cracks of a semiconductor light emitting device according to the comparative example.

FIG. 8 illustrates a comparative example, in which a light emitting structure 220 is formed by stacking a first conductivity-type semiconductor layer 221, an active layer 222, and a second conductivity-type semiconductor layer 223 on an upper surface of a growth substrate 210. A support substrate 240 is attached to the light emitting structure 220. A reflective layer 230a and an insulating layer 230b are formed on a surface of the light emitting structure 220. As shown in FIG. 8, when no trench is formed, a generated crack C is not blocked, but instead propagates. As can be seen in portion 'A' in FIG. 9, cracks C propagate across the individual semiconductor light emitting devices 100 (see FIG. 7).

The trench 130 may have a better effect of blocking a crack C when the light emitting structure 120 is etched to be deeper. However, if the light emitting structure 120 is etched deeply enough for the growth substrate 110 to be exposed, the light emitting structures 120 may be separated, making it difficult to separate the growth substrate 110 from the light emitting structures 120. Meanwhile, if the depth of trench 130 is excessively thin, a crack C may not be properly blocked but may propagate to a different region. Thus, the trench 130 may have a depth such that the foregoing problems do not occur.

In an embodiment of the present inventive concept, the trench 130 may be formed to have a depth ranging from 3% to 25% of the thickness of the light emitting structure 120. When the thickness of the light emitting structure 120 is about 6 μm, the trench 130 may be formed to have a depth ranging from about 2000 Å to 15000 Å. FIG. 11 shows that when a trench is formed to have a depth of 2000 Å, a crack C generated in a region of the light emitting structure 120 is blocked, rather than propagating to a different region. The trench 130 blocks the crack C generated in a region of the light emitting structure 120. Although the crack C may be generated, the crack C may propagate only within a region divided by the trench 130. Thus, since propagation of the crack C is blocked, a possibility that the individual semiconductor light emitting device 100 may be damaged can be reduced, which leads to an increase in production yield of the semiconductor light emitting device.

FIG. 12A is a photograph image showing a semiconductor light emitting device without a trench, FIG. 12B is a photograph image showing a semiconductor light emitting device with the trench 130 formed to have a depth of 15000 Å, and FIG. 12C is a photograph image showing a portion (portion D) of a generated crack blocked by the trench 130.

Also, the trench 130 may have a better effect of blocking a crack C when the trench 130 has a larger width. However, if the width of the trench is excessively increased, a removed region of the light emitting structure is increased to reduce yield of the semiconductor light emitting device. Thus, the trench 130 may be formed such that the foregoing problems are eliminated. Here, in comparison to the effect of reducing the crack C according to an increase in the depth of the trench 130, the effect of blocking the crack C according to an increase in the width of the trench 130 is somewhat limited.

In an embodiment of the present inventive concept, the trench 130 may be formed to have a width less than 70 μm, and specifically, may be formed to have a width ranging from 7 μm to 20 μm.

Figure 3:
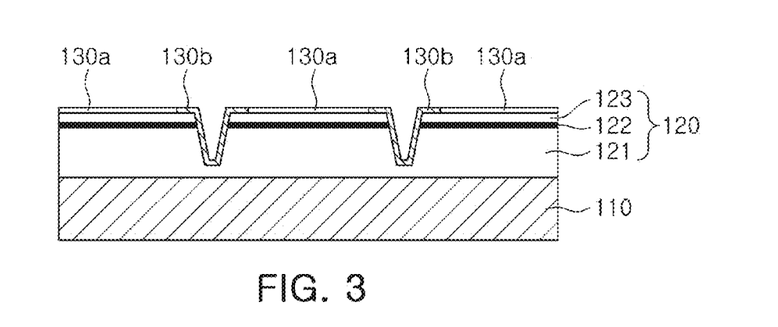

Thereafter, as illustrated in FIG. 3, an insulating layer 130b may be formed on an inner surface of the trench 130 among the surfaces of the light emitting structure 120. A reflective layer 130a may be formed on the other remaining portions of the surfaces of the light emitting structure 120.

The insulating layer 130b may be formed on the inner surface of the trench 130. Besides, the insulating layer 130b may also be formed on a region etched to be removed during an operation of cutting the light emitting structure 120 into individual semiconductor light emitting devices 100 (see FIG. 7). In addition, the insulating layer 130b may be used as a mask for depositing the reflective layer 130a on one surface of the light emitting structure 120. In an embodiment of the present inventive concept, the insulating layer 130b material may be $SiO_2$, SiNx, $Si_3N_4$, $Al_2O_3$, $TiO_2$, or the like.

The reflective layer 130a is positioned on one surface of the semiconductor light emitting device 100 to reflect light emitted from the active layer 122 to the other surface of the semiconductor light emitting device 100, thus enhancing light extraction efficiency. The reflective layer 130a may be formed as multiple layers or as a single layer through a process such as MOCVD, HVPE, MBE, sputtering, or the like. In an embodiment of the present inventive concept, the reflective layer 130a material may be indium tin oxide (ITO), silver (Ag), nickel (Ni), aluminum (Al), titanium (Ti), palladium (Pd), platinum (Pt), ruthenium (Ru), gold (Au), rhodium (Rh), iridium (Ir), AgCu, or AgCuPd, or the like. A distributed Bragg reflector (DBR) may be further formed as the reflective layer 130a.

Figure 4:
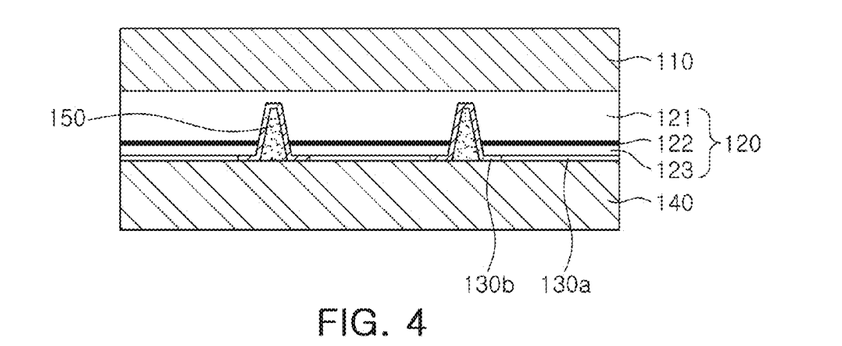

Next, as illustrated in FIG. 4, a support substrate 140 is attached. As for the support substrate, a substrate made of Si, GaAs, GaP, AlGaINP, Ge, SiSe, GaN, AlInGaN, or InGaN, or a substrate made of a single metal such as aluminum (Al), zinc (Zn), silver (Ag), tungsten (W), titanium (Ti), nickel (Ni), gold (Au) molybdenum (Mo), platinum (Pt), palladium (Pd), copper (Cu), chromium (Cr), or iron (Fe), or a substrate made of an alloy thereof may be attached to compound semiconductors to form the support substrate 140.

Here, the support substrate 140 may be attached to the light emitting structure 120 through a bonding layer 150. The support substrate 140 may be formed by using a plating process. For example, a metal such as copper (Cu), nickel (Ni), or the like, may be plated on the light emitting structure 120 to form the support substrate 140.

The bonding layer 150 may be formed by filling the interior of the trench 130 on which the insulating layer 130b is deposited. The bonding layer 150 material may be nickel (Ni), tin (Sn), platinum (Pt), titanium (Ti), gold (Au), Au—Sn, indium (In), Au—Ag, or Pb—Sn, or the like.

Figure 5:
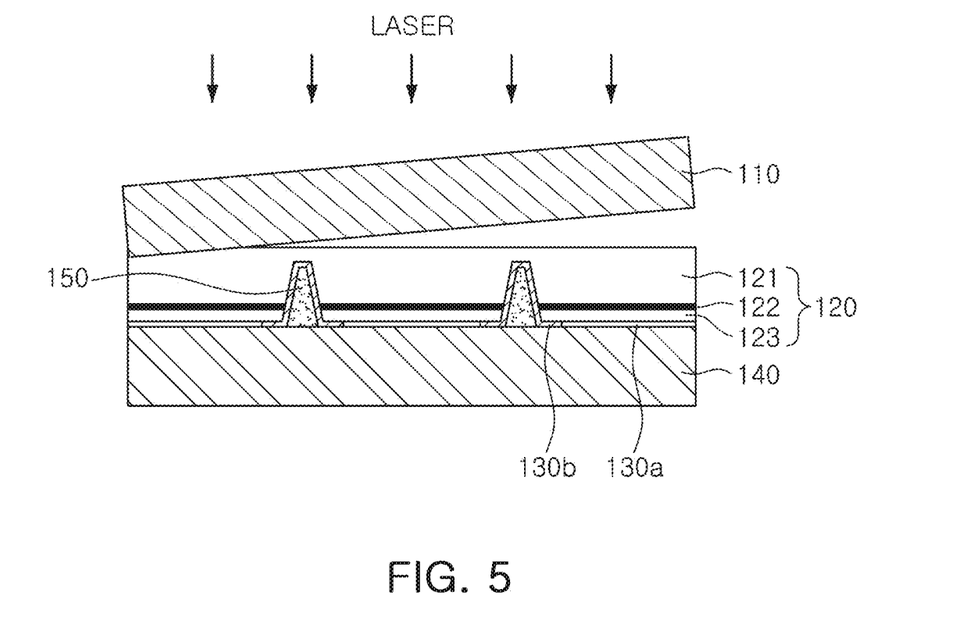

Thereafter, as shown in FIG. 5, the growth substrate 110 is separated from the light emitting structure 120 by a physical method such as a laser lift-off (LLQ), or the like.

Figure 6:
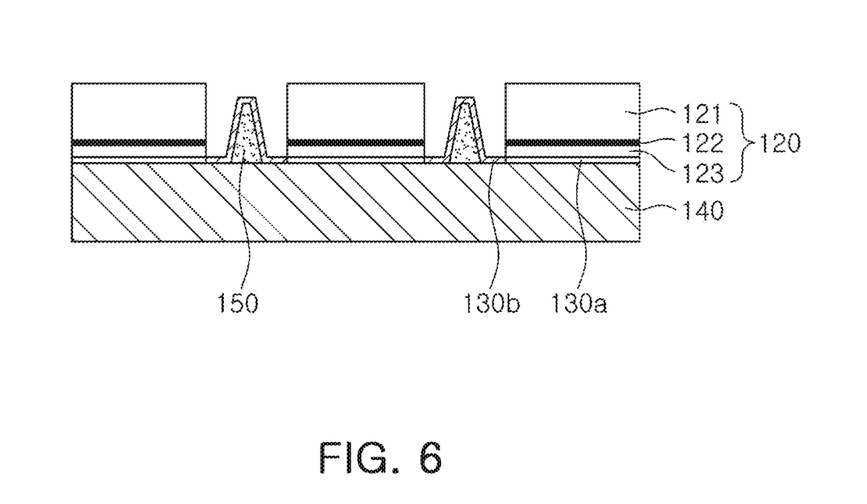

Thereafter, as illustrated in FIG. 6, a region of the light emitting structure 120 including the trench 130 is etched to form isolated structures of the light emitting structure 120 corresponding to individual semiconductor light emitting devices 100 (see FIG. 7).

Thereafter, as shown in FIG. 7, an electrode 160 is formed on the first conductivity semiconductor layer 121, and the light emitting structure is subsequently cut into the individual semiconductor light emitting devices 100 through a scribing or breaking process.

The electrode 160 is ohmic-contacted with the first conductivity-type semiconductor layer 121 of the light emitting structure 120. Here, the electrode 160 may be formed as a single layer or multiple layers, and made of a material selected from nickel (Ni), gold (Au), silver (Ag), titanium (Ti), chromium (Cr), copper (Cu), and the like. The electrode 160 may be formed through a process such as MOCVD, HVPE, MBE, sputtering, or the like.

Although not separately shown, a transparent electrode layer made of a material such as ITO, Ni/Au, or the like, may be formed on the first conductivity-type semiconductor layer 121, such that current spreading is accelerated to further enhance light extraction efficiency.

As set forth above, according to embodiments of the inventive concept, since damage to a semiconductor layer of the semiconductor light emitting device is reduced, yield can be enhanced and production costs can be reduced.

Although a few exemplary embodiments of the present inventive concept have been shown and described, the present inventive concept is not limited to the described exemplary embodiments. Instead, it would be appreciated by those skilled in the art that changes may be made to these exemplary embodiments without departing from the principles and spirit of the inventive concept, the scope of which is defined by the appended claims and their equivalents.

What is claimed is:

1. A method for manufacturing a semiconductor light emitting device, the method comprising:

forming a light emitting structure having a first conductivity-type semiconductor layer, an active layer, and a second conductivity-type semiconductor layer on a growth substrate;

forming a trench in a portion of a first surface of the light emitting structure to divide the light emitting structure into individual light emitting structures, the trench having a depth such that the growth substrate is not exposed;

forming an insulating layer on an inner surface of the trench;

providing a support substrate on the first surface of the light emitting structure following the forming of the insulating layer;

separating the growth substrate from the light emitting structure; and cutting the light emitting structure into individual semiconductor light emitting devices by performing steps of:
  etching a portion of a second surface of the light emitting structure opposite to the first surface corresponding to a position of the trench to expose the insulating layer through the second surface; and
  cutting the support substrate in the exposed portion of the insulating layer.

2. The method of claim 1, wherein the trench is formed in a region of the light emitting structure that is removed by etching when the light emitting structure is cut into the individual semiconductor light emitting devices.

3. The method of claim 1, wherein the trench is formed such that each of the individual light emitting structures is isolated.

4. The method of claim 1, wherein the depth of the trench ranges from 3% to 25% of a thickness of the light emitting structure.

5. The method of claim 4, wherein the trench is formed to have the depth ranging from 2000 Å to 15000 Å.

6. The method of claim 1, wherein the trench is formed through an inductively coupled plasma reactive ion etching (ICPRIE) method.

7. The method of claim 1, wherein the trench is formed through a wet etching method.

8. The method of claim 1, wherein the trench has sloped side walls.

9. The method of claim 1, wherein the insulating layer includes a material selected from the group consisting of $SiO_2$, $SiN_X$ (where x is a positive integer), $Si_3N_4$, $Al_2O_3$, and $TiO_2$.

10. The method of claim 1, further comprising:
  forming a reflective layer on one surface of the light emitting structure.

11. The method of claim 10, wherein the reflective layer includes a material selected from the group consisting of indium tin oxide (ITO), silver (Ag), nickel (Ni), aluminum (Al), titanium (Ti), palladium (Pd), platinum (Pt), ruthenium (Ru), gold (Au), rhodium (Rh), iridium (Ir), AgCu, and AgCuPd.

12. The method of claim 11, wherein the reflective layer includes a distributed Bragg reflector (DBR).

13. The method of claim 1, further comprising:
  filling the trench with a bonding layer, after the forming of the insulating layer on the inner surface of the trench.

14. The method of claim 13, wherein the bonding layer includes a material selected from the group consisting of nickel (Ni), tin (Sn), platinum (Pt), titanium (Ti), gold (Au), Au-Sn, indium (In), Au-Ag, and Pb-Sn.

15. The method of claim 13, wherein the etching of the portion of the second surface of the light emitting structure to expose the insulating layer through the second surface comprises etching a region of the light emitting structure including and surrounding the trench such that only the insulating layer and the bonding layer remain between adjacent individual light emitting structures on the support substrate.

16. The method of claim 1, wherein the separating of the growth substrate from the light emitting structure is performed according to a laser lift-off method.

17. The method of claim 1, wherein the trench has a width ranging from 7 μm to 20 μm.

18. The method of claim 1, wherein the forming of the trench comprises forming a plurality of trenches in the first surface of the light emitting structure to form an intermittent dotted line of trenches in the first surface.

19. A method for manufacturing a semiconductor light emitting device, the method comprising:
  forming a light emitting structure having a first conductivity-type semiconductor layer, an active layer, and a second conductivity-type semiconductor layer on a growth substrate;
  forming a trench in a portion of a first surface of the light emitting structure to divide the light emitting structure into individual light emitting structures, the trench having a depth such that the growth substrate is not exposed;
  forming an insulating layer on an inner surface of the trench; and
  cutting the light emitting structure into individual semiconductor light emitting devices such that a region of the light emitting structure in which the trench is formed is removed by performing steps of:
    etching a portion of a second surface of the light emitting structure opposite to the first surface corresponding to a position of the trench to expose the insulating layer through the second surface; and
    cutting a support substrate in the exposed portion of the insulating layer.

20. The method of claim 19, further comprising:
  providing the support substrate on the light emitting structure;
  separating the growth substrate from the light emitting structure.

* * * * *